(12) United States Patent
Cheng

(10) Patent No.: US 10,175,536 B2
(45) Date of Patent: *Jan. 8, 2019

(54) LIQUID CRYSTAL DISPLAY DEVICE, QUANTUM RODS ALIGNMENT PLATE AND METHOD FOR MAKING THE SAME

(71) Applicant: Shenzhen China Star Optoelectronics Technology Co., Ltd., Shenzhen, Guangdong (CN)

(72) Inventor: Xiaoping Cheng, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 228 days.

This patent is subject to a terminal disclaimer.

(21) Appl. No.: 15/109,638

(22) PCT Filed: May 19, 2016

(86) PCT No.: PCT/CN2016/082598
§ 371 (c)(1),
(2) Date: Jul. 3, 2016

(87) PCT Pub. No.: WO2017/181468
PCT Pub. Date: Oct. 26, 2017

(65) Prior Publication Data
US 2018/0088370 A1   Mar. 29, 2018

(30) Foreign Application Priority Data

Apr. 19, 2016 (CN) .......................... 2016 1 0244688

(51) Int. Cl.
*G02F 1/1337* (2006.01)
*G02F 1/1335* (2006.01)
(Continued)

(52) U.S. Cl.
CPC ............ *G02F 1/1337* (2013.01); *C09K 11/08* (2013.01); *G02F 1/1335* (2013.01);
(Continued)

(58) Field of Classification Search
CPC .................... G02F 1/1337; G02F 1/133378
See application file for complete search history.

(56) References Cited

U.S. PATENT DOCUMENTS 9,874,780 B2 * 1/2018 Wei .................... G02F 1/13362
2007/0296897 A1   12/2007 Liu
(Continued)

FOREIGN PATENT DOCUMENTS

CN           101893787 A       11/2010
CN           105467653 A        4/2016
(Continued)

*Primary Examiner* — Dung Nguyen
(74) *Attorney, Agent, or Firm* — Andrew C. Cheng

(57) ABSTRACT

The present disclosure provides a liquid crystal display device, a quantum rods alignment plate and the method for making the same. The method includes following steps: providing a substrate; arranging a quantum rods layer on the substrate, the surface of the quantum rods layer has a first group, the first group includes an alignment group, the alignment group is used to align the liquid crystal. By the above method, the present disclosure can saving the cost of the production and can greatly increase the transmission and the brightness of the liquid crystal display device, and also enhance the display color gamut of the liquid crystal display device.

11 Claims, 4 Drawing Sheets

(51) Int. Cl.
*C09K 11/08* (2006.01)
*C09K 11/02* (2006.01)
*G02B 5/30* (2006.01)
*H01L 33/50* (2010.01)

(52) U.S. Cl.
CPC .......... *C09K 11/025* (2013.01); *G02B 5/3033* (2013.01); *G02F 1/133528* (2013.01); *H01L 33/50* (2013.01)

(56) References Cited

U.S. PATENT DOCUMENTS

| | | |
|---|---|---|
| 2010/0110345 A1 | 5/2010 | Sakai |
| 2013/0027639 A1 | 1/2013 | Chien |
| 2017/0038638 A1 | 2/2017 | Park |
| 2017/0160579 A1 | 6/2017 | Cheng |
| 2017/0255045 A1 | 9/2017 | Wei |
| 2017/0363908 A1* | 12/2017 | Jang ................ G02F 1/133514 |

FOREIGN PATENT DOCUMENTS

| | | |
|---|---|---|
| JP | 2001337351 A | 12/2001 |
| KR | 20120007780 A | 1/2012 |

* cited by examiner

LIQUID CRYSTAL DISPLAY DEVICE, QUANTUM RODS ALIGNMENT PLATE AND METHOD FOR MAKING THE SAME

FIELD OF THE DISCLOSURE

The present disclosure relates to a display technology field, and more particularly to a liquid crystal display device and a quantum rods alignment plate and method for making the same.

BACKGROUND OF THE DISCLOSURE

With the progress of science and technology and social development, people are dependent for information exchange and transfer, etc. is increasing. The display device and physical infrastructure as the main carrier of information exchange and transfer, has become engaged in a number of photoelectric information research scientists eager to seize the hot spots and highlands.

Quantum dot display technology in the color gamut coverage, color control accuracy, the various dimensions of the RGB color purity, have been fully upgraded, is regarded as the commanding heights of the global display technology, it is also seen as the global revolution in display technology. Quantum dot display technology to achieve a revolutionary display color gamut, to restore the most realistic color image. With the TCL released the first quantum dot TV, the international quantum dot display camp has begun to take shape.

The radius of the quantum rod is generally about 0–20 nm, the length is about dozens nm semiconductor nanocrystals, and is composed by the nanomaterials of II-VI group or III-V group. Due to the quantum confinement effect, the internal transport of electrons and holes is limited, so that a continuous band structure into the level structure separation. When the size of the quantum dots is not the same degree of quantum confinement of electrons and holes are not the same, different discrete energy level structure. After excitation by external energy, namely quantum dots of different sizes that emit different wavelengths of light, which is light of various colors.

The size of the quantum rods also can control, you can make the emission wavelength range to cover the entire infrared and visible light, and the light emitting narrow-band, high color saturation; high quantum efficiency of quantum materials; stabilizing material properties; preparation simple and diverse, can be prepared from the solution, rich in resources.

The LCD display device of the prior art usually is use the properties of the quantum rod can change the direction of the light, thereby the quantum rod directly into the conventional LCD display device, this aspect will increase the production cost of LCD display device, on the other hand will increase the thickness of the LCD display device, thereby reducing the transmission and brightness of the LCD display device.

SUMMARY OF THE DISCLOSURE

The present disclosure to solve the technical problem is provides a liquid crystal display device and a quantum rods alignment plate and method for making the same, possible to reduce the cost of liquid crystal display device and increase the transmission and brightness of the liquid crystal display device.

To solve the above technical problems, one aspect of the present disclosure used is: providing a method for manufacturing a quantum rods alignment plate, the manufacturing method includes: providing a substrate; arranging a quantum rods layer on the substrate, the surface of the quantum rods layer has a first group, the first group includes an alignment group, the alignment group is used to align the liquid crystal.

Wherein, before the step of arranging a quantum rods layer on the substrate further includes: Arranging a film on the substrate, the film includes a second group, wherein the second group includes a first binding group; the step of arranging a quantum rods layer on the substrate specifically includes: preparing a functional layer containing a plurality of quantum rods, the surface of the quantum rods has the first group, the first group further includes a second binding group, the second binding group is combined with the first binding group to form the quantum rods as a flat state.

Wherein, before the step of arranging a film on the substrate includes:
arranging an electrode on the substrate;
the step of arranging a quantum rods layer on the substrate further includes:
energizing the electrode to form an electric field, so that the quantum rods in the flat state is rotated to form the alignment and the quantum rods layer will have the characteristics of polarization.

Wherein, the step of the second binding group combined with the first binding group includes:
the first binding group combined with the second binding group through the effect of adsorption or bonding.

To solve the above technical problems, another aspect of the present disclosure used is: providing a quantum rods alignment plate, the quantum rods alignment plate includes: a substrate; a quantum rods layer arranged on the substrate, a first group is arranged on the surface of the quantum rods layer, the first group includes an alignment group, the alignment group is used to align the liquid crystal.

Wherein, the quantum rods alignment plate further includes: a film arranged between the substrate and the quantum rods layer, the film includes a second group, wherein the second group includes a first binding group; the quantum rods layer includes a function layer with a plurality of quantum rods, the surface of the quantum rods has the first group, the first group further includes a second binding group, the second binding group is combined with the first binding group to form the quantum rods as a flat state.

Wherein, the first binding group is combined with the second binding group through the effect of adsorption or bonding.

Wherein, the quantum rods alignment plate further includes: an electrode arranged between the substrate and the film, an electric filed is formed when energizing the electrode, so that the quantum rods in the flat state is rotated to form the alignment and the quantum rods layer will have the characteristics of polarization.

To solve the above technical problems, the other aspect of the present disclosure used is: providing a liquid crystal display device, the liquid crystal display device includes: a first substrate arranged corresponding to a second substrate; a liquid crystal layer arranged between the first substrate and the second substrate; a quantum rods alignment plate arranged at least one side of the liquid crystal layer, wherein, the quantum rods alignment plate includes: a substrate; a quantum rods layer arranged on the substrate, and a first group arranged on the surface of the quantum rods layer, the first group includes an alignment group, the alignment group is used to align the liquid crystal.

Wherein, the quantum rods alignment plate further includes: a film arranged between the substrate and the quantum rods, the film includes a second group, the second group includes a first binding group; the quantum rods layer includes a function layer with a plurality of quantum rods, the surface of the quantum rods has the first group, the first group further includes a second binding group, the second binding group is combined with the first binding group to form the quantum rods as a flat state.

Wherein, the first binding group is combined with the second binding group through the effect of adsorption or bonding.

Wherein, the quantum rods alignment plate further includes: an electrode arranged between the substrate and the film, an electric filed is formed when energizing the electrode, so that the quantum rods in the flat state is rotated to form the alignment and the quantum rods layer will have the characteristics of polarization.

Wherein, the quantum rods alignment plate is arranged on the both sides of the liquid crystal layer, the liquid crystal display device further includes a polarizer, the polarizer arranged one side of the quantum rods alignment plate away from the liquid crystal layer is used to obtain a polarized light by affect with the quantum rods alignment plate.

Wherein, the quantum rods alignment plate is arranged one side of the liquid crystal layer, the liquid crystal display device further includes a polarizer and an alignment film; the polarizer arranged on the one side of the quantum rods alignment plate away from the liquid crystal layer is used to obtain a polarized light by affect with the quantum rods alignment plate; the alignment film arranged on the other side of the liquid crystal layer is used to align the liquid crystal of the other side of the liquid crystal layer.

The beneficial effects of the present disclosure are: the situation is different from the prior art, the present disclosure providing a liquid crystal display device and a quantum rods alignment plate and the method making the same, wherein, the method for manufacturing the quantum rods alignment plate includes the following step: providing a substrate, and a quantum rods layer is arranged on the substrate, the surface of the quantum rods layer has the first group, the first group includes an alignment group, the alignment group is used to align the liquid crystal. Therefore, the quantum rods alignment plate of the present disclosure may be used instead of the alignment plate of the liquid crystal display device, thereby reducing the cost of the liquid crystal display device and increasing the transmission and brightness of the liquid crystal display device.

DETAILED DESCRIPTION OF PREFERRED EMBODIMENTS

Figure 1:
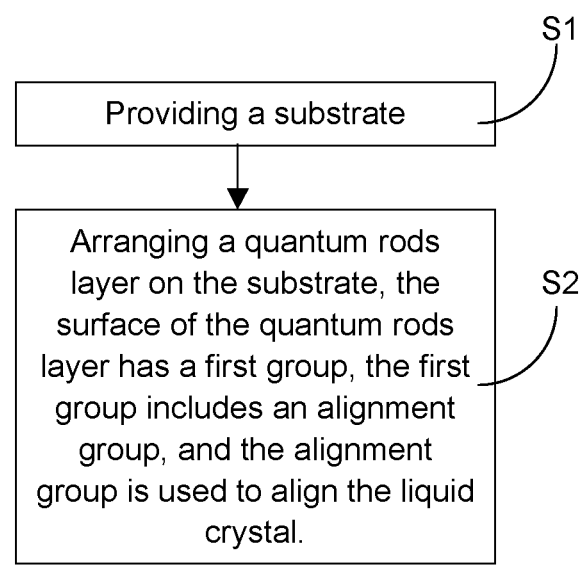
FIG. 1 is a flow chart of a method for manufacturing the quantum rods alignment plate provided by the embodiment of the present disclosure.
Figure 2:
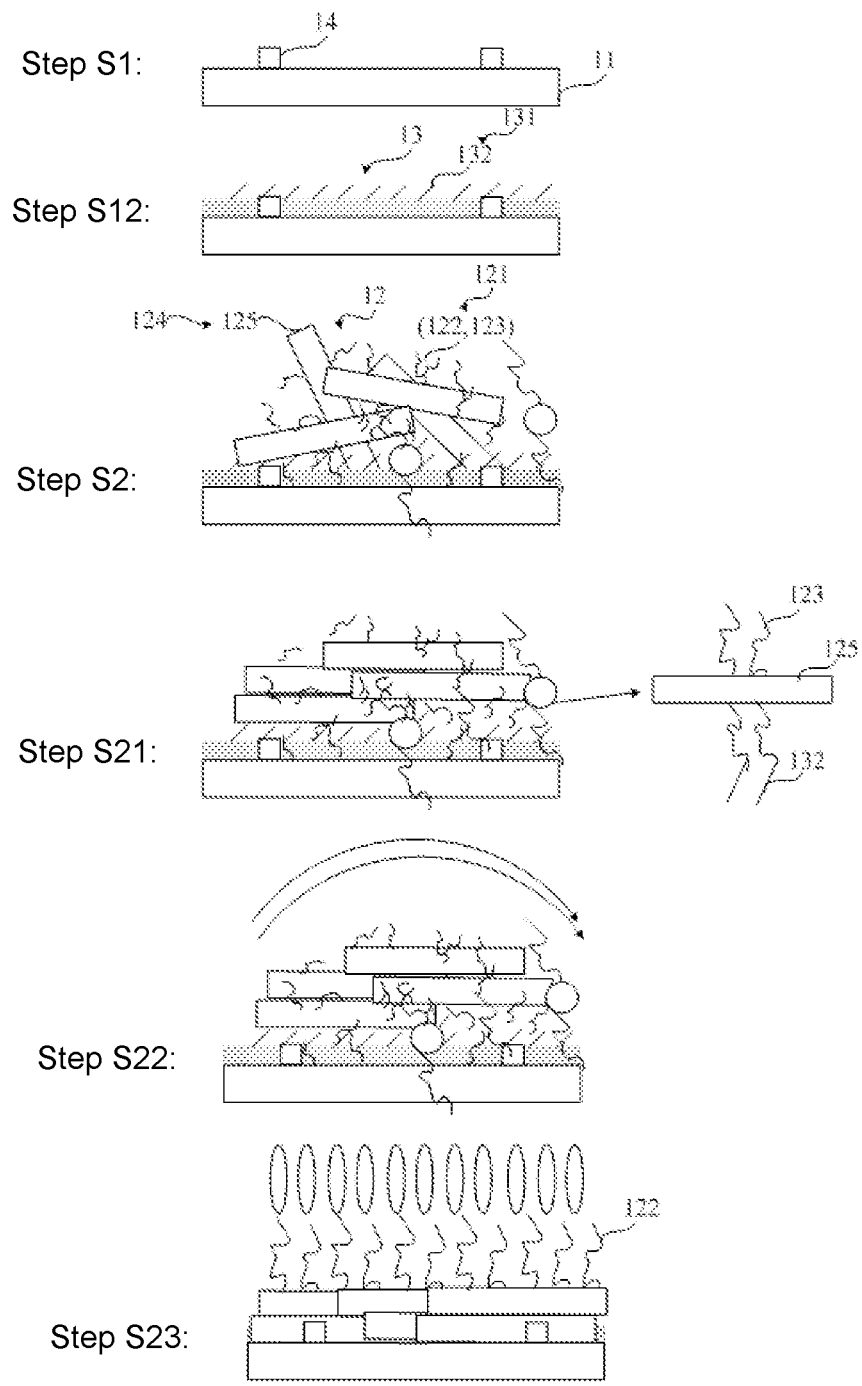
FIG. 2 is a process view corresponding to the manufacturing method shown in FIG. 1.

Refer to FIG. 1 and FIG. 2, FIG. 1 is a flow chart of a method for manufacturing the quantum rods alignment plate provided by the embodiment of the present disclosure, FIG. 2 is a process view corresponding to the manufacturing method shown in FIG. 1. As shown in FIGS. 1 and 2, the manufacturing method of the embodiment of the present disclosure includes:

Step S1: providing a substrate 11.

Step S2: arranging a quantum rods layer 12 on the substrate 11, the surface of the quantum rods layer 12 has a first group 121, the first group 121 includes an alignment group 122, and the alignment group 122 is used to align the liquid crystal.

This step in particular: preparing a functional layer 124 containing a plurality of quantum rods 125, the surface of the quantum rods 125 has the first group 121. The first group 121 further includes a binding group 123.

The first group 121 in this step can be obtained by the method of grafting, modification, etc. of the surface group to the existing quantum rod material, which can be grafted and modified the different groups according to the actual needs. For example, can be grafted and modified the different alignment group 122 according the different alignment mode. The alignment group is not limited to the alignment mode, can be light alignment, vertical alignment or the like.

Wherein, before this step further includes a film 13 on the substrate 11, as the step S12 shown in FIG. 2, the film 13 includes a second group 131. The second group 131 includes a binding group 132. The arranging method of the second group 131 is same as the arranging method of the above first group 121, not discussed here.

Wherein, the binding group 123 is combined with the binding group 132 as the step S21 shown in FIG. 2 to form the quantum rods as a flat state. Specifically, the binding group 123 is combined with the binding group 132 further through the effect of adsorption or bonding, e.g. combined by the method of light, heat, other catalytic initiator, self-organization adsorption, etc.

In the present embodiment, the material of the binding group 123 and 132 include a variety materials, as long as it can be adsorbed or bonded to each other can be used as a bonding group of the present disclosure.

In other embodiments, in order to simplify the manufacturing process, reduce the cost and omit the film 13, specifically, the binding group 123 is directly combined the substrate 11 to be a film.

In the present method, before arranging the film 13 further arranging an electrode 14 on the substrate 11, as the step 51 shown in FIG. 2. The present method further energizes to the electrode 14, as the step S22 shown in FIG. 2, forming an electric field to rotate the quantum rods 125 in the flat state and to form the alignment. With the aspect ratio of the shape of the quantum material is increased, the light of the quantum rods layer 12 will be gradually changed from the polarized light of the circular bias line. Thus, the quantum rods layer 12 may be changed the polarization state of the incident light and having the polarization characteristics. Such that when the light of the different polarization directions passing through the quantum rods layer 12, some light is blocked and some can be passed, the polarization direction of the through light is the same, i.e. becomes a linearly polarized light and a high degree of the polarization can be obtained. The liquid crystal of the liquid crystal layer can be well controlled the linearly polarized light to avoid the problem of the light leakage and the decreasing contrast.

From above, the quantum rods alignment plate of the present embodiment achieves the functions of aligning to the liquid crystal and polarization at the same time, the quantum rods alignment plate of the present embodiment can be used instead of the original alignment plate of the liquid crystal display device, and built the liquid crystal display device of the quantum rods alignment plate of the present embodiment can omit the polarizer, thus saving the cost of the production and can greatly increase the transmission and the brightness of the liquid crystal display device, and also enhance the display color gamut of the liquid crystal display device.

Figure 3:
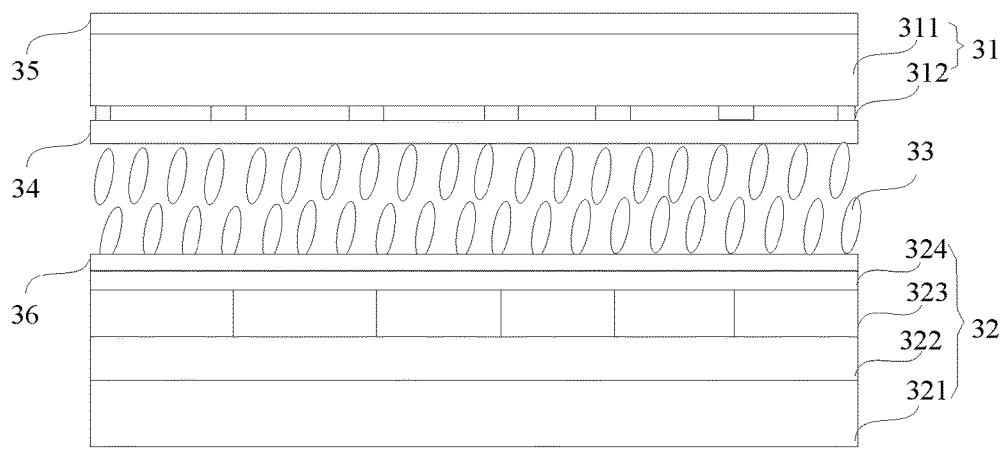
FIG. 3 is a schematic structure view of a LCD device provided by the embodiment of the present disclosure.

Please refer to FIG. 3, FIG. 3 is a schematic structure view of a LCD device provided by the embodiment of the present disclosure. As shown in FIG. 3, the liquid crystal display device 30 of the present embodiment includes a first substrate 31, a second substrate 32, a liquid crystal layer 33 and a quantum rods alignment plate 34. Wherein, the first substrate 31 is arranged corresponding to the second substrate 32, the liquid crystal layer 33 is arranged between the first substrate 31 and the second substrate 32. The quantum rods alignment plate 34 is arranged at least one side of the liquid crystal layer 33 to align the liquid crystal of the liquid crystal layer 33.

In particular, the quantum rods alignment plate 34 is manufactured by the described previously method. For details, please refer to FIG. 2, the quantum rods alignment plate 34 specifically includes a substrate 11 and a quantum rods layer 12. Wherein, the quantum rods layer 12 is arranged on the substrate 11, the surface of the quantum rods layer 12 is arranged a first group 121, the first group 121 includes an alignment group 122, and the alignment group 122 is used to align the liquid crystal of the liquid crystal layer 33.

Further, the quantum rods alignment plate 34 further includes a film 13, the film 13 is arranged between the substrate 11 and the quantum rods layer 12, the film includes a second group 131, the second group 131 includes a binding group 132. The quantum rods layer 12 includes a function layer 124 with a plurality of quantum rods 125, the surface of the quantum rods have a first group 121, the first group 121 further includes a binding group 123. The binding group 123 is combined with the binding group 132 to form the quantum rods 125 as a flat state.

Specifically, the binding group 123 is combined with the binding group 132 further through the effect of adsorption or bonding, e.g. combined by the method of light, heat, other catalytic initiator, self-organization adsorption, etc.

In the present embodiment, the first group 121 can be obtained by the method of grafting, modification, etc. of the surface group to the existing quantum rod material, which can be grafted and modified the different groups according to the actual needs. For example, can be grafted and modified the different alignment group 122 according the different alignment mode. The alignment group is not limited to the alignment mode, can be light alignment, vertical alignment or the like.

The arranging method of the second group 132 is as same as the arranging method of the first group, not discussed here.

Further, the quantum rods alignment plate 34 further includes an electrode 14, the electrode 14 is arranged between the first substrate 11 and the film 13, a electric field is formed when the electrode 14 is energizing, so that the quantum rods 125 in the flat state is rotated to form the alignment and the quantum rods layer 12 will have the characteristics of polarization.

In the present embodiment, the first substrate 31 includes a glass plate 311 and a black matrix (BM) 312 arranged on the glass plate 311, the second substrate 32 includes a glass plate 321, a thin film transistor (TFT) layer 322 arranged on the glass plate 321, a color filter layer (i.e. RGB layer) 323 arranged on the TFT layer 322 and a indium tin oxides (ITO) layer 324 arranged on the color filter layer 323.

In the present embodiment, the quantum rods alignment plate 34 is arranged one side of the liquid crystal layer 33. The liquid crystal display device 30 further includes a polarizer 35 and an alignment film 36, wherein, the polarizer 35 arranged one side of the quantum rods alignment plate 34 and away from the liquid crystal layer 33 is used to obtain the polarized light with the quantum rods alignment plate 34. The alignment film 36 arranged another side of the liquid crystal layer 33 is used to align another side of the liquid crystal of the liquid crystal layer 33.

Figure 4:
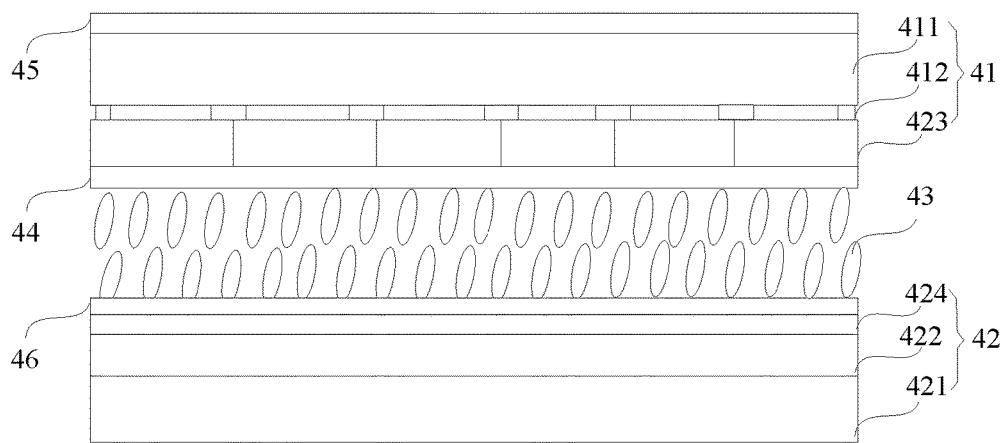
FIG. 4 is another schematic structure view of a LCD device provided by the embodiment of the present disclosure.

Please refer FIG. 4, FIG. 4 is another schematic structure view of a LCD device provided by the embodiment of the present disclosure. As shown in FIG. 4, the liquid crystal display device 40 of the present embodiment still includes a first substrate 41, a second substrate 42, a liquid crystal layer 43, a quantum rods alignment plate 44, a polarizer 45 and an alignment plate 46.

Wherein, the difference between the liquid crystal display device 40 of the present embodiment and the liquid crystal display device 30 shown in FIG. 3 is: the color filter layer 423 of the liquid crystal display device 40 of the present embodiment is arranged on the first substrate 411, specifically, the first substrate 41 includes a glass plate 411, a black matrix (BM) layer 412 arranged on the glass plate 411 and a color filter layer 423 arranged on the BM layer. The second substrate 42 includes a glass plate 421, a thin film transistor (TFT) layer 422 arranged on the glass plate 421 and an indium tin oxides (ITO) layer 424 arranged on the TFT layer 422.

Figure 5:
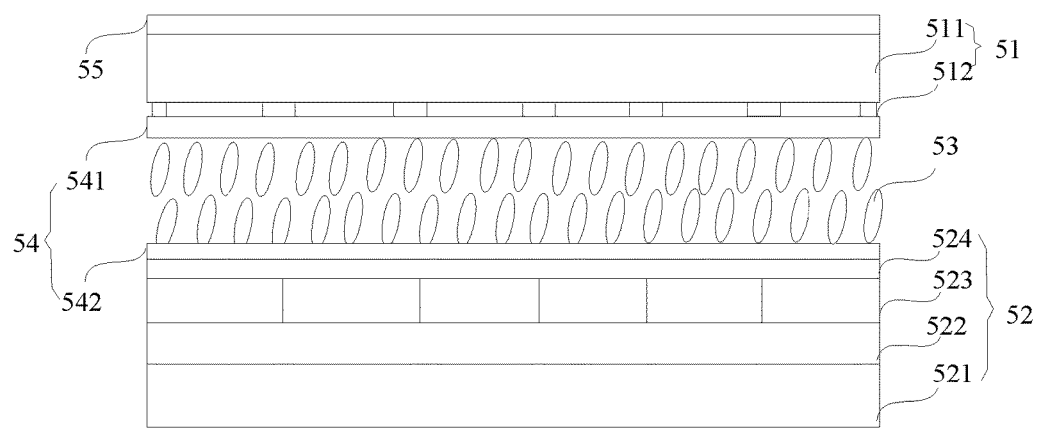
FIG. 5 is the other schematic structure view of a LCD device provided by the embodiment of the present disclosure.

Please refer to FIG. 5, FIG. 5 is the other schematic structure view of a LCD device provided by the embodiment of the present disclosure. As shown in FIG. 5, the liquid crystal display device 50 of the present embodiment still includes a first substrate 51, a second substrate 52, a liquid crystal layer 53, a quantum rods alignment plate 54 and a polarizer 55.

Wherein, the difference between the liquid crystal display device 50 of the present embodiment and the liquid crystal display device 30 shown in FIG. 3 is: the present embodiment has two quantum rods alignment plates 54, 541 and 542, are arranged between both sides of the liquid crystal layer 53 respectively. I.e. the liquid crystal of the liquid crystal layer 53 of the present embodiment is all aligns through the quantum rods alignment plate 54.

Figure 6:
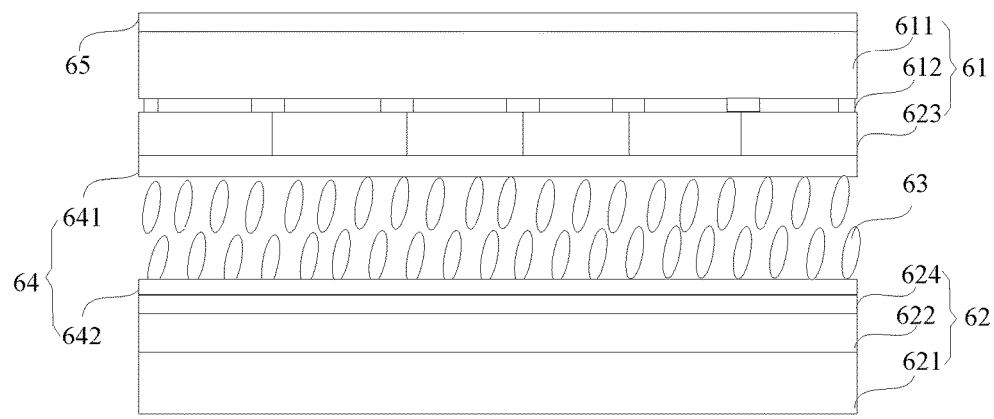
FIG. 6 is the other schematic structure view of a LCD device provided by the embodiment of the present disclosure.

Please refer to FIG. 6, FIG. 6 is the other schematic structure view of a LCD device provided by the embodiment of the present disclosure. As shown in FIG. 6, the liquid crystal display device 60 of the present embodiment still includes a first substrate 61, a second substrate 62, a liquid crystal layer 63, a quantum rods alignment plate 64 and a polarizer 65.

Wherein, the difference between the liquid crystal display device 60 of the present embodiment and the liquid crystal display device 40 shown in FIG. 4 is: the present embodiment has two quantum rods alignment plates 64, 641 and 642, are arranged both sides of the liquid crystal layer 63 respectively. I.e. the liquid crystal of the liquid crystal layer 63 of the present embodiment is all aligns through the quantum rods alignment plate 64.

In summary, the quantum rods alignment plate of the present embodiment achieves the function of alignment to the liquid crystal, further achieves the function of the polarizing at the same time, so that the liquid crystal display device can omit a polarizer, thereby saving the manufacturing cost, reducing the thickness of the liquid crystal display device and improving the transmittance and the brightness of the liquid crystal display device.

Above are only embodiments of the present disclosure is not patented and therefore limit the scope of the disclosure, all the contents of the present disclosure utilize the specification made equivalent structures or equivalent process transformation, either directly or indirectly related technologies used in other areas are included in the patent empathy scope of the disclosure.

What is claimed is:

1. A method for manufacturing a quantum rods alignment plate, wherein, the manufacturing method comprises:
    providing a substrate;
    arranging a quantum rods layer on the substrate, the surface of the quantum rods layer has a first group, the first group comprises an alignment group, and the alignment group is used to align the liquid crystal
    wherein, before the step of arranging a quantum rods layer on the substrate further comprises:
    arranging a film on the substrate, the film comprises a second group, wherein the second group comprises a first binding group;
    the step of arranging a quantum rods layer on the substrate specifically comprises: preparing a functional layer containing a plurality of quantum rods, the surface of the quantum rods has the first group, the first group further comprises a second binding group, the second binding group is combined with the first binding group to form the quantum rods as a flat state.

2. The manufacturing method according to claim 1, wherein, before the step of arranging a film on the substrate comprises:
    arranging an electrode on the substrate;
    the step of arranging a quantum rods layer on the substrate further comprises:
    energizing the electrode to form an electric field, so that the quantum rods in the flat state is rotated to form the alignment and the quantum rods layer will have the characteristics of polarization.

3. The manufacturing method according to claim 1, wherein, the step of the second binding group combined with the first binding group comprises:
    the first binding group combined with the second binding group through the effect of adsorption or bonding.

4. A quantum rods alignment plate, wherein, the quantum rods alignment plate comprises:
    a substrate;
    a quantum rods layer arranged on the substrate, a first group is arranged on the surface of the quantum rods layer, the first group comprises an alignment group, the alignment group is used to align the liquid crystal
    wherein, the quantum rods alignment plate further comprises: a film arranged between the substrate and the quantum rods layer, the film comprises a second group, wherein the second group comprises a first binding group;
    the quantum rods layer comprises a function layer with a plurality of quantum rods, the surface of the quantum rods has the first group, the first group further comprises a second binding group, the second binding group is combined with the first binding group to form the quantum rods as a flat state.

5. The quantum rods alignment plate according to claim 4, wherein, the first binding group is combined with the second binding group through the effect of adsorption or bonding.

6. The quantum rods alignment plate according to claim 4, wherein, the quantum rods alignment plate further comprises:
    an electrode arranged between the substrate and the film, an electric filed is formed when energizing the electrode, so that the quantum rods in the flat state is rotated to form the alignment and the quantum rods layer will have the characteristics of polarization.

7. A liquid crystal display device, wherein, the liquid crystal display device comprises:
    a first substrate arranged corresponding to a second substrate;
    a liquid crystal layer arranged between the first substrate and the second substrate;
    a quantum rods alignment plate arranged at least one side of the liquid crystal layer, wherein, the quantum rods alignment plate comprises:
    a substrate;
    a quantum rods layer arranged on the substrate, and a first group arranged on the surface of the quantum rods layer, the first group comprises an alignment group, the alignment group is used to align the liquid crystal
    wherein, the quantum rods alignment plate further comprises: a film arranged between the substrate and the quantum rods, the film comprises a second group, and the second group comprises a first binding group;
    the quantum rods layer comprises a function layer with a plurality of quantum rods, the surface of the quantum rods has the first group, the first group further comprises a second binding group, the second binding group is combined with the first binding group to form the quantum rods as a flat state.

8. The liquid crystal display device according to claim 7, wherein, the first binding group is combined with the second binding group through the effect of adsorption or bonding.

9. The liquid crystal display device according to claim 7, wherein, the quantum rods alignment plate further comprises:
    an electrode arranged between the substrate and the film, an electric filed is formed when energizing the electrode, so that the quantum rods in the flat state is rotated to form the alignment and the quantum rods layer will have the characteristics of polarization.

10. The liquid crystal display device according to claim 7, wherein, the quantum rods alignment plate is arranged on the both sides of the liquid crystal layer, the liquid crystal display device further comprises a polarizer, the polarizer arranged one side of the quantum rods alignment plate away from the liquid crystal layer is used to obtain a polarized light by affect with the quantum rods alignment plate.

11. The liquid crystal display device according to claim 7, wherein, the quantum rods alignment plate is arranged one side of the liquid crystal layer, the liquid crystal display device further comprises a polarizer and an alignment film;
    the polarizer arranged on the one side of the quantum rods alignment plate away from the liquid crystal layer is used to obtain a polarized light by affect with the quantum rods alignment plate;

the alignment film arranged on the other side of the liquid crystal layer is used to align the liquid crystal of the other side of the liquid crystal layer.

* * * * *